(12) United States Patent
Hart et al.

(10) Patent No.: US 12,253,252 B2
(45) Date of Patent: Mar. 18, 2025

(54) POWER FILTERING DEVICE

(71) Applicant: Swarm Holdings LLC., Salt Lake City, UT (US)

(72) Inventors: Jonathan Neil Hart, Salt Lake City, UT (US); Paul Mark Michalczuk, Bainbridge Island, WA (US); Jesse Alden Smith, Ogden, UT (US)

(73) Assignee: SWARM HOLDINGS LLC., Salt Lake City, UT (US)

( * ) Notice: Subject to any disclaimer, the term of this patent is extended or adjusted under 35 U.S.C. 154(b) by 195 days.

(21) Appl. No.: 17/952,089

(22) Filed: Sep. 23, 2022

(65) Prior Publication Data
US 2024/0102644 A1    Mar. 28, 2024

(51) Int. Cl.
| | | |
|---|---|---|
| *H03G 5/00* | (2006.01) | |
| *F21V 23/04* | (2006.01) | |
| *F21V 33/00* | (2006.01) | |
| *H03H 11/04* | (2006.01) | |
| *H04R 1/02* | (2006.01) | |

(52) U.S. Cl.
CPC .......... *F21V 33/0056* (2013.01); *F21V 23/04* (2013.01); *H03H 11/04* (2013.01); *H04R 1/028* (2013.01)

(58) Field of Classification Search
CPC ..... F21V 33/0056; F21V 23/04; H03H 11/04; H04R 1/028
See application file for complete search history.

(56) References Cited

U.S. PATENT DOCUMENTS

| | | |
|---|---|---|
| 5,980,057 A | 11/1999 | Christie |
| 6,580,361 B2 | 6/2003 | Bucher |
| 8,042,961 B2 | 10/2011 | Massara et al. |
| 8,299,903 B2 | 10/2012 | Haase et al. |
| 9,087,514 B2 | 7/2015 | Jonsson |
| 10,178,747 B1 | 1/2019 | Rivera et al. |
| 10,609,477 B1 * | 3/2020 | Chadha ................. H03F 3/217 |
| 2006/0033454 A1 | 2/2006 | Mathews et al. |
| 2007/0223723 A1 | 9/2007 | Haase |
| 2011/0317861 A1 | 12/2011 | Haase |
| 2013/0293155 A1 | 11/2013 | Campbell et al. |
| 2017/0070195 A1 * | 3/2017 | Arknæs-Pedersen ... H03F 3/187 |
| 2017/0070820 A1 * | 3/2017 | Behringer .............. G06V 20/20 |
| 2017/0070821 A1 * | 3/2017 | Arknaes-Pedersen ...................... H04R 29/007 |
| 2017/0070822 A1 * | 3/2017 | Skovenborg ........... H04R 3/005 |
| 2018/0087766 A1 | 3/2018 | Zhang et al. |
| 2019/0149902 A1 | 5/2019 | Cook et al. |
| 2021/0152400 A1 * | 5/2021 | Thurmond .......... H04L 25/0276 |

* cited by examiner

*Primary Examiner* — Simon King
(74) *Attorney, Agent, or Firm* — Jason P. Webb; Pearson Butler

(57) ABSTRACT

An audio filtering and power extraction apparatus for filtering out audio signal and extracting power from a combined signal and direct-current power line, with an input configured to couple to a combined signal and direct-current power line, a filtering extractor system functionally coupled to the input, a DC sensing switch circuit, and a second order low-pass filter functionally coupled to the DC sensing switch circuit, the second order low-pass filter including, an inductor, a capacitor and resistor in series with each other, and an output functionally coupled to an output of the filtering extractor system and through which output extracted power is provided.

14 Claims, 13 Drawing Sheets

POWER FILTERING DEVICE

BACKGROUND OF THE INVENTION

Field of the Invention

The present invention relates to power combining and filtering devices, specifically to combining and separating power on a single line.

Description of the Related Art

In the related art, it has been known to power both lights and speakers within the same fixture. These fixtures require the use of multiple wires in order to correctly power both the speakers and the lights. Some improvements have been made in the field. Examples of references related to the present invention are described below in their own words, and the supporting teachings of each reference are incorporated by reference herein:

Existing two wire speaker/light systems prevent light flickering due to variations in the audio signal and also protect the speakers and/or lights from being over-powered or even damaged due to strong power signals intended for the other components of the system. There are existing systems that combine signals and deliver those combined signals to both the lights and the speakers, but in those systems the flickering lights are intended to be in synch with intensity fluctuations in the audio (generally music) and therefore such flickering is desired.

U.S. Pat. No. 8,299,903, to Haase et. al, discloses a combination light and sound producing fixture and combination screw—in light with speakers element is disclosed where the fixture is installed in a wall or ceiling or on a wall or ceiling. The light bulb/speaker can be screwed or secured into a standard light bulb socket. The sound producing elements is a coaxial arrangement of speakers having a low frequency transducer and one or more high frequency transducers that can be directed to emit sound in a particular direction. The fixture or bulb may further include digital signal processing to modify the sound to account for obstructions in or near the fixture. The surface of the sound transducer can be reflective in nature to provide focusing or diffusion of the light from the lighting elements. The lighting elements are incandescent, fluorescent or low voltage LED type that may include adjustment for lighting intensity and color.

U.S. Patent Application Publication No.: 2018/0087766, to Zhang et al., discloses The instant disclosure provides an LED light, including: a light cap, a hollow heat sink, a drive assembly, a speaker assembly, a light source assembly and a lampshade, wherein the light cap, the hollow heat sink and the lampshade are sequentially connected and form a receiving space, the drive assembly, the speaker assembly and the light source assembly sequentially arranged in the receiving space in the direction of the light cap to the lampshade, and the speaker assembly and the light source assembly are respectively electrically connected with the driving assembly, and the surface of the hollow heat sink provided with multiple holes, and the speaker assembly arranged facing the hole.

U.S. Patent Application Publication No.: 2007/0223723, to Haase et al, discloses a combination low voltage light and sound producing fixture is disclosed for installation in a yard wall or ceiling or on a wall or ceiling. Outdoor lighting and sound is produced with low voltage lighting that is wired or solar powered for operation. The fixture may further include digital signal processing to modify the sound to account for obstructions in near or around the fixture. The fixture may include a feedback system that allow the fixture to self modify its frequency response. The signal to the fixture is provided by wired or wireless interface. The surface of the sound transducer can be reflective in nature to provide focusing or diffusion of the light from the lighting elements. The lighting elements are incandescent, fluorescent or low voltage LED type that may include adjustment for lighting intensity or color.

U.S. Patent Application Publication No.: 2019/0149902 to Cook et al. discloses A combined light and loudspeaker driver device 10 is suitable for mounting in, for example, a ceiling void. It comprises a housing 15 that supports a loudspeaker driver 20, a heat removal element 120, electronic components 25 and a light source 110. The heat removal element 120 includes a column 120a extending along a central longitudinal axis of the housing 15 to a base of the housing 15, where it meets a heat sink 40 formed around the central longitudinal axis to the rear of the housing 15. The light source 110 provides task lighting and is a source of heat. It is mounted on a front end of the column distal from the heat sink 40 at the base of the housing 15, so as to optimize conduction of heat away from the light source 110. The light source 110 is also positioned radially inwardly of a speaker diaphragm 130 also centred around the central longitudinal axis of the housing 15. The housing 15 is generally cup shaped and has side walls 15a. The interior of the housing side walls 15a is parallel with the central longitudinal axis of the housing 15 over the majority of the rearward depth thereof. This results in a large void behind the loudspeaker diaphragm 130, leading to improved sound.

U.S. Patent Application Publication No.: 2011/0317861, to Haase et al, discloses a combination low voltage light and sound producing fixture is disclosed for installation in a yard wall or ceiling or on a wall or ceiling. Outdoor lighting and sound is produced with low voltage lighting that is wired or solar powered for operation. The fixture may further include digital signal processing to modify the sound to account for obstructions in near or around the fixture. The fixture may include a feedback system that allows the fixture to self-modify its frequency response. The signal to the fixture is provided by wired or wireless interface. The surface of the sound transducer can be reflective in nature to provide focusing or diffusion of the light from the lighting elements. The lighting elements are incandescent, fluorescent or low voltage LED type that may include adjustment for lighting intensity or color.

The inventions heretofore known suffer from a number of disadvantages which include: not being able to include both AC and DC power or signals on the same line, not being able to separate different power and signal bands from one another, not working with standard power and signal supply components, parasitically harvesting energy from the signal generator thus decreasing the system capacity and not allowing independent operation, and/or requiring excessively large and/or expensive parts not fit for manufacturing.

What is needed is a combined light and speaker power system that solves one or more of the problems described herein and/or one or more problems that may come to the attention of one skilled in the art upon becoming familiar with this specification.

SUMMARY OF THE INVENTION

The present invention has been developed in response to the present state of the art, and in particular, in response to the problems and needs in the art that have not yet been fully solved by currently available power and signal combining and separating devices. Accordingly, the present invention has been developed to provide a satisfactory power and signal combining and separating device There may be an audio filtering and power extraction apparatus for filtering out audio signal and extracting power from a combined signal and direct-current power line including both DC power and an electrical audio signal, which may include an input configured to functionally couple to a combined signal and direct-current power line, a filtering extractor system functionally coupled to the input, which may include a DC sensing switch circuit and a second order low-pass filter functionally coupled to the DC sensing switch circuit, the second order low-pass filter may include an inductor or virtual inductor in combination with a capacitor and resistor in series with each other, and an output functionally coupled to an output of the filtering extractor system and through which output extracted power is provided, the apparatus may further include a polarity-protection circuit functionally coupled to the output, an overcurrent-protection circuit disposed within the apparatus such that current is limited therethrough, a heat sensor disposed within a body of the apparatus and functionally coupled to a current limiting circuit functionally coupled to the input or output, the DC sensing switch circuit includes at least one of a relay, a solid state relay, a power transistor, or a MOSFET, the DC sensing switch circuit includes an internal low-pass filter, the second order low-pass filter forms part of a higher order low-pass filter, a light functionally coupled to the output, the input includes only two functional electrical conductors.

There may also or instead be a method for filtering out audio signal and extracting power from a combined signal and direct-current power line, which may include the steps of providing an audio filtering and power extraction apparatus having an input configured to functionally couple to a combined signal and direct-current power line, an extractor system, and an output functionally coupled to an output of the filtering extractor system and through which output extracted power is provided, receiving a combined signal and direct current power input, monitoring the combined signal and direct current power input for electronic current flow, passing the combined signal and direct current power input through the filtering extractor system, thereby filtering out an electrical audio signal from the combined signal and direct current power line, and providing a filtered direct current power output, the method may further include the provided filtering extractor system further includes a DC sensing switch circuit, the provided extractor system further includes a second order low-pass filter functionally coupled to the DC sensing switch circuit, the provided second order low-pass filter further includes an inductor or virtual inductor in combination with a capacitor and resistor in series with each other, the step of providing filtered direct current power from the output, and/or the extractor system further includes a polarity-protection circuit functionally coupled to the output.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims or may be learned by the practice of the invention as set forth hereinafter.

BRIEF DESCRIPTION OF THE DRAWINGS

In order for the advantages of the invention to be readily understood, a more particular description of the invention briefly described above will be rendered by reference to specific embodiments that are illustrated in the appended drawing(s). It is noted that the drawings of the invention are not to scale. The drawings are mere schematics representations, not intended to portray specific parameters of the invention. Understanding that these drawing(s) depict only typical embodiments of the invention and are not, therefore, to be considered to be limiting its scope, the invention will be described and explained with additional specificity and detail through the use of the accompanying drawing(s), in which.

DETAILED DESCRIPTION OF THE INVENTION

Figure 1:
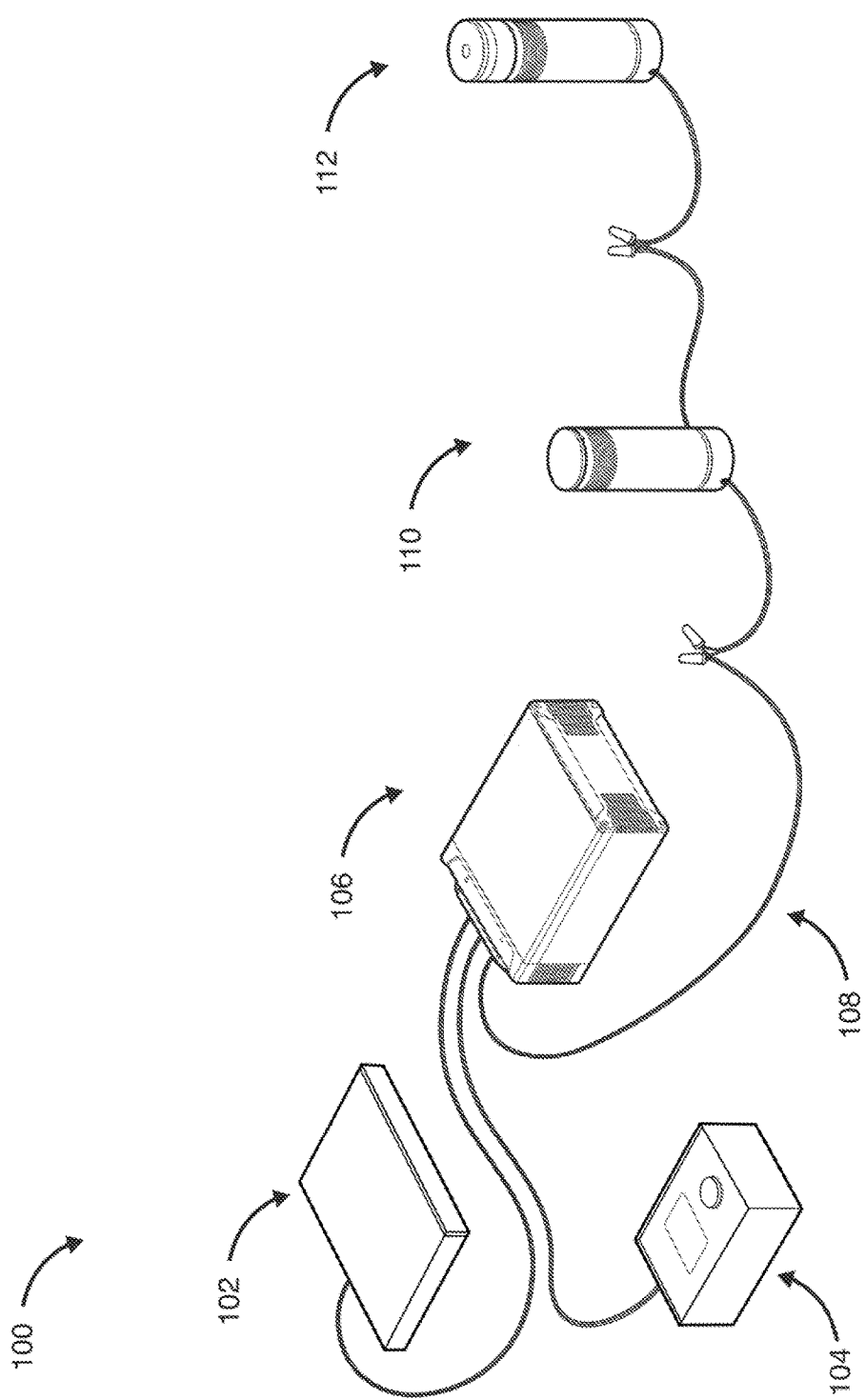
FIG. 1 is a module diagram of a system to combine multiband power signals and extract power out of the same to provide both a useful audio power and a useful light power on the same wire, according to one embodiment of the invention.

For the purposes of promoting an understanding of the principles of the invention, reference will now be made to the exemplary embodiments illustrated in the drawing(s), and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

Reference throughout this specification to an "embodiment," an "example" or similar language means that a particular feature, structure, characteristic, or combinations thereof described in connection with the embodiment is included in at least one embodiment of the present invention. Thus, appearances of the phrases an "embodiment," an "example," and similar language throughout this specification may, but do not necessarily, all refer to the same embodiment, to different embodiments, or to one or more of the figures. Additionally, reference to the wording "embodiment," "example" or the like, for two or more features, elements, etc. does not mean that the features are necessarily related, dissimilar, the same, etc.

Each statement of an embodiment, or example, is to be considered independent of any other statement of an embodiment despite any use of similar or identical language characterizing each embodiment. Therefore, where one embodiment is identified as "another embodiment," the identified embodiment is independent of any other embodiments characterized by the language "another embodiment." The features, functions, and the like described herein are considered to be able to be combined in whole or in part one with another as the claims and/or art may direct, either directly or indirectly, implicitly or explicitly.

As used herein, "comprising," "including," "containing," "is," "are," "characterized by," and grammatical equivalents thereof are inclusive or open-ended terms that do not exclude additional unrecited elements or method steps. "Comprising" is to be interpreted as including the more restrictive terms "consisting of" and "consisting essentially of."

Unless otherwise limited, the one wire system described herein may serve a variety of purposes, including but not limited to providing power to speakers, lights, cameras, fans, kiosks, HVAC systems, sprinklers, pumps, and the like and combinations thereof.

FIG. 1 is a module diagram of a system to combine multiband power signals and extract power out of the same to provide both a useful audio power and a useful light power on the same wire, according to one embodiment of the invention. The illustrated system 100 includes an audio power signal generator 102, a light power signal generator 104, a combiner 106, a wire 108, a speaker 110, and a light 112. Advantageously, the system 100 allows a user to operate devices which use different power sources (e.g. AC power vs. DC power, Digital signal vs. AC signal) on the same wire 108, such that the user does not need to run separate cables for each device.

The illustrated audio signal generator 102 is shown connected to the combiner 106 and generates an analog (i.e. AC) power signal. The audio signal generator 102 then sends the signal out to the combiner 106. The illustrated light power signal generator 104 is shown connected to the combiner 106 and generally generates an AC or DC power signal. The light power signal generator 104 then sends the signal out to the combiner 106. The illustrated audio signal generator 102 source and the illustrated light power 104 source may be custom devices configured to provide specific functionality under specific specifications or may be off—the shelf components readily available or already present in a home audio and lighting system. As a non-limiting example, the audio signal generator 102 may be an Episode EA-AMP-HYP-2D-1000, a Crown Cdi 1000, a Sonance Sonamp 2-750MKII, or any other suitable audio amplifier, and the light power source 104 may be an FX Luminaire Luxor Controller (FX-LUX-300-SS), a Hampton Bay DIY-300PS, a Kichler 12217 landscape lighting transformer, or any other suitable landscape lighting power supply.

The illustrated combiner 106 is a multi-band signal combiner. It is shown connected to each of the audio signal generator 102 and light power signal generator 104, as well as having an output that is the "one wire" that connects the power signals to the illustrated speaker(s) and light(s). The combiner 106 takes the signals from each of the audio signal generator 102 as well as light power signal generator 104 and combines both bands such that they both are able to exist on the same wire 108 in a useful manner. In one embodiment, the combiner 106 may take the light power and convert the light power to DC. The combiner would then send the now DC light power and the AC audio power downline. In this embodiment, such a conversion to the light power allows the DC light power and/or the AC audio power to be later filtered.

The illustrated speaker 110 is shown connected to the combiner 106 as well as the light 112. The speaker 110 accepts the AC power from the combiner 106 via an input and blocks the DC power through that input such that the speaker 110 does not receive both bands outputted by the combiner 106. As illustrated, there is only one speaker 110, however in other embodiments there may be a plurality of speakers 110 or no speakers 110. In other embodiments, the speaker 110 may be any number or combination of devices which take AC power or signal.

The illustrated light 112 is shown connected to the speaker 110 as well as the combiner 106. The light 112 blocks the AC power from the combiner 106 and accepts the DC power such that the light 112 does not receive both bands outputted by the combiner 106. As illustrated, there is only one light 112, however in other embodiments there may be a plurality of lights 112 or no lights 112. In other embodiments, the light 112 may be any number or combination of devices which take DC power. In one such non-limiting embodiment, there may be a device which accepts both AC signal and DC power. Examples of this type of device include, but are not limited to, a light with addressing and/or color changing capability, a speaker with a built-in amplifier, powered addressable blinds, a garage door opener, and the like and combinations thereof. Such a device may filter out the proper power and/or signal from the base combined line, or may accept prior-filtered power and/or signals.

In operation, the light power signal generator 102 and audio signal generator 104 send the respective AC and DC power to the combiner 106. The combiner 106 receives both the electrical signal/audio power and direct-current power/light power and then combines them onto a single wire 108. Once combined, the combiner 106 sends them downline to the light 112 and/or speaker 110. The light 112 and/or speaker 110 block out the undesired signal/power from the combined line wire 108 and accept the desired signal/power.

Advantageously, the audio filtering and power extraction system 100, when assembled, allows both an audio signal as well as a light power signal to be provided on the same line while still allowing for completely separate control of each and preventing that separate control from undesired interactions, wherein the system allows the power from the combined signal and direct-current power line to be extracted as needed for its useful intended purposes. Ultimately, the system 100 allows multiple devices powered with different signals and/or power types to be able to function on the same line, therefore negating the need to run additional wire. This allows users to use existing wires that only carried one type of power/signal to plug in normally incompatible devices and power them through the same wire.

Figure 2:
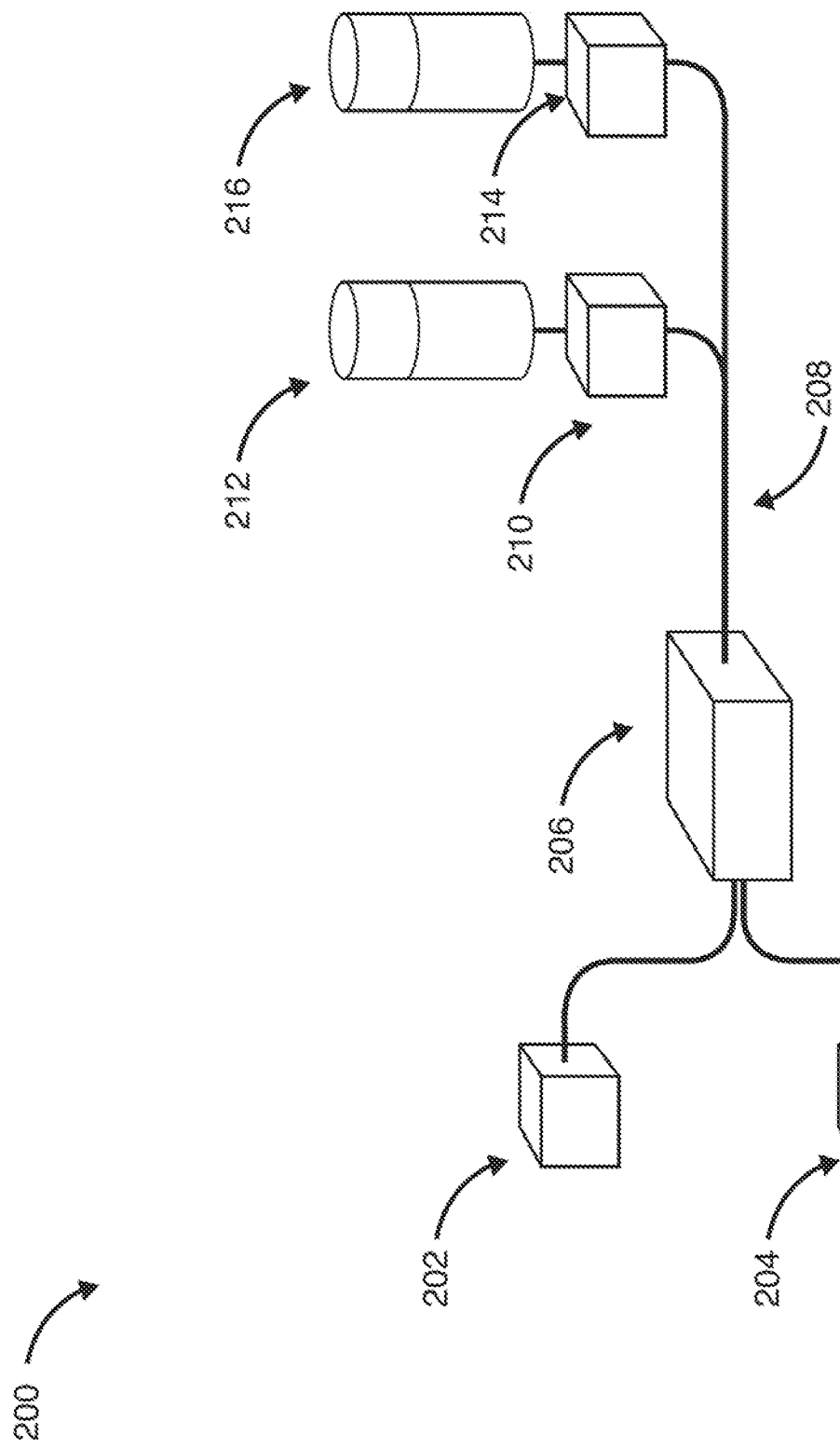
FIG. 2 is a module diagram of a system to provide both an audio signal and light power on the same wire, according to one embodiment of the invention.

FIG. 2 is a module diagram of a system to provide both an audio signal and light power on the same wire, according to one embodiment of the invention. The illustrated system 200 includes an audio signal generator 202, a light power signal generator 204, a filtering extractor system 206, a wire 208, a DC Filter 210, an AC/Audio Signal accepting device 212, an AC Filter 214 and a DC/Light Power accepting device 216. In this embodiment, the filtering of signals/power for the AC/Audio Signal accepting device 212 and DC/Light Power accepting device 216 is done prior to the devices themselves, such that ordinary devices without special filters may be used.

In some embodiments, the combiner 106 is identical or substantially similar to the filtering extractor system 206, in which both devices filter out undesirable signal and pass out a cleaned signal. In other embodiments, the illustrated combiner 106 does not clean signals, rather it is substantially similar to a multi-band combiner in that combines multiple signals onto one band for filtering downline.

Figure 3:
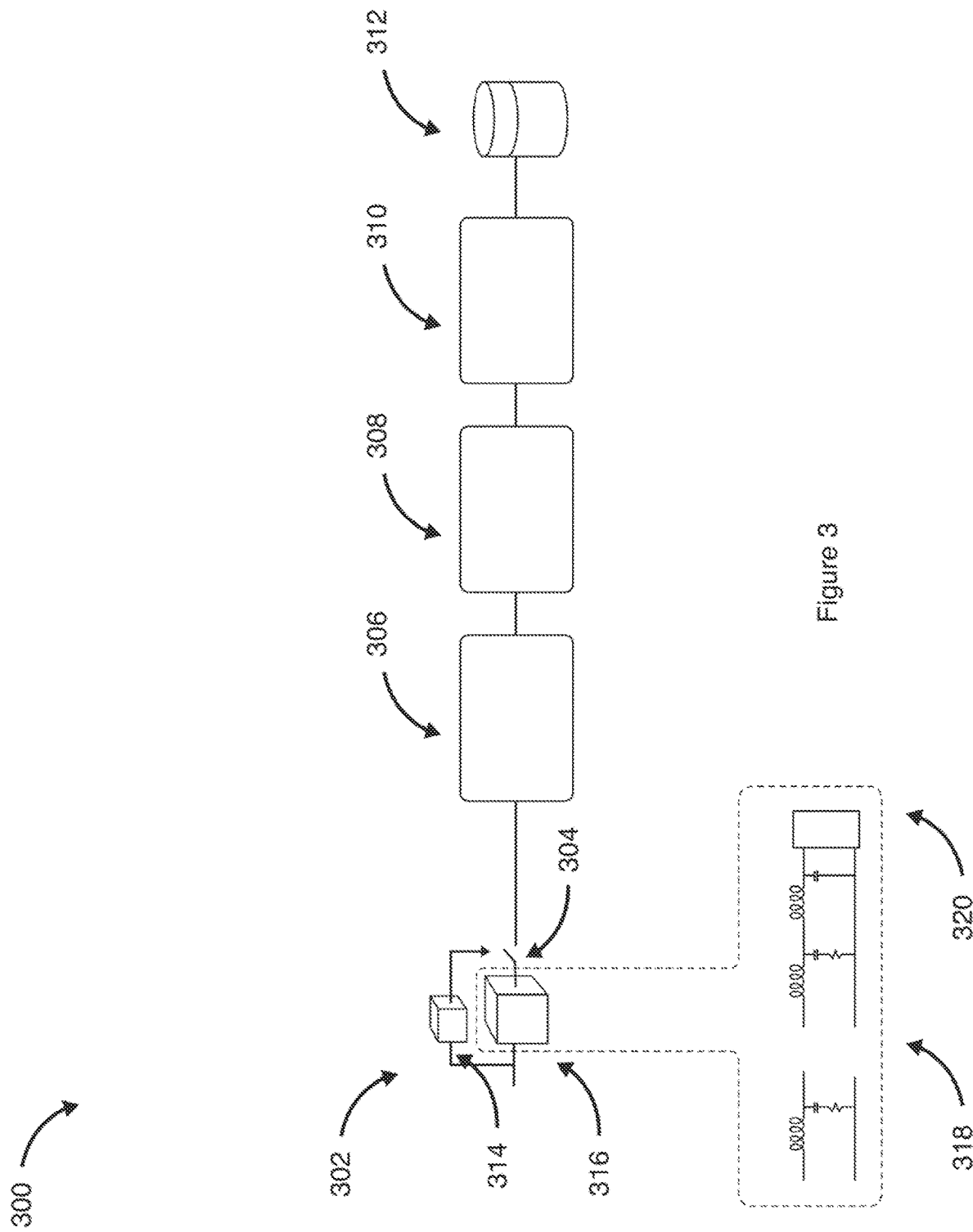
FIG. 3 is a module diagram of a one-wire system, according to one embodiment of the invention.

FIG. 3 is a module diagram of a one-wire system, according to one embodiment of the invention. The illustrated system 300 includes a filtering extractor 302, a polarity protection circuit 306, an overcurrent-protection circuit 308, a heat sensor 310, and a light 312.

The illustrated filtering extractor circuit 302 includes a sensing low-pass filter 314, a primary low-pass filter 316, and a switch 304. Accordingly, the filtering extractor circuit 302 filters out signals above a desired frequency, letting the lower desired frequencies through. The illustrated sensing low-pass filter 314 monitors the line for signals below a certain frequency. If the sensing low-pass filter 314 detects signals below a certain frequency, then it turns on the switch 304 to allow the signal to pass through the primary low-pass filter 316. An example of one embodiment of a low-pass filter is the DC to 400 MHz low-pass filter from Fairview Microwave out of Lewisville, Texas. Examples of different types of switches 316 are MOSFETs, power transistors, relays, and solid-state relays.

An example of one non-limiting embodiment of a metal-oxide-semiconductor field-effect transistor (MOSFET) is the SIPMOS series MOSFET from Infineon Technologies out of Neubiberg, Germany. An example of one embodiment of a power transistor is the MTP Series Power Transistor from Onsemi out of Phoenix, Arizona. An example of one embodiment of a relay is the RH3B Series Relay from IDEC out of Thief River Falls, Minnesota. An example of one embodiment of a solid-state relay is the SSRL Series Relay from Omega Engineering out of Norwalk, Connecticut. In another non-limiting embodiment, the filtering extractor 302 could be integrated into another device, such as the enable pin of an IC. In one embodiment, the output of the low-pass filter 318 may be used to control the ADJ pin of a MT7201c LED driver From Maxic Technology out of Beijing, China.

The illustrated primary low-pass filter 316 may include the components of second order low-pass filter 318, which is shown including an inductor and/or virtual inductor, a capacitor, and resistor. The inductor stores energy in a magnetic field when electric current flows through it and resists high frequency changes in current flow. The virtual inductor is a circuit which generates an inductive reactance similarly to an inductor through various components such as resistors, capacitors, operational amplifiers, and the like. The capacitors and resistors are shown connected to the inductor/virtual inductor in parallel with the load to shunt additional high frequency energy to ground to assist the inductor in safely blocking most of the AC, wherein the inductor and the capacitor work together to reduce the amount of high frequency AC leakage. When doing this, the inductor must have sufficient inductance to keep the capacitors from pulling down the impedance of the line at lower frequencies. If a suitably large inductance cannot be used because of size, cost, or weight constraints, then adding a resistor in series with the capacitor can help set a minimum impedance for the filter. An example of one embodiment of a low-pass filter is the 5 section low-pass filter by Pasternack out of Irvine, California.

In other embodiments, primary low-pass filter 316 may include additional filter components to increase the order of the low-pass filter, and to catch anything missed by the low-pass filter 318 or to further filter out lower ranges. An example of one embodiment of a low-pass filter is the 5 section low-pass filter by Pasternack out of Irvine, California. There may be both low and high-pass filters included in other embodiments.

Further non-limiting embodiments may include higher order high and/or low-pass filters that may be connected to the inductor and which include a plurality of first-order low-pass filters and/or high-pass filters connected to further remove unwanted signal from the line. For example, an example of a higher order low-pass filter 320 is shown, which may be replacing the low-pass filter 318 or included in addition to it. There may be mixes of second order and higher order filters in some embodiments.

The polarity protection circuit 306 is connected to the output of the primary low-pass filter 316 and ensures that the device is not damaged if the polarity of the power supply is reversed. In the case the polarity is reversed, the polarity protection circuit 306 automatically inverts the signal so the downstream circuit can operate normally. Some examples of polarity protection circuits 306 include but are not limited to diodes, full bridge rectifiers, half bridge rectifiers, PNP transistors, and/or P-channel FETs/MOSFETs.

The overcurrent protection circuit 308 is connected to the polarity protection circuit 306 and ensures that the device is not damaged if the current within the device reaches a level which may cause excessive temperatures and/or loads in the components. In the case the sensed current is too high for the components; the polarity protection circuit 308 opens the circuit to protect the various electronics in the circuit. Some examples of overcurrent protection circuits 308 include but are not limited to electromechanical circuit breakers, fusible links, solid state power switches, and/or fuses.

The heat sensor 310 is connected to the overcurrent protection circuit 308 and senses the heat from the various electronic devices. Similarly, to the overcurrent protection circuit 308, the heat sensor 310 senses whether the temperature of the components is too high. In the case that there are temperatures that are too high, the heat sensor 310 provides an indication that there may be issues, such as but not limited to turning on a light, changing light colors, flashing a light, creating an audible noise, and in some cases may even take action to reduce or remove load on the circuit to protect the components.

The illustrated light 312 is connected to the heat sensor 310 and is the primary load that uses the filtered power from the system. In other embodiments, the light 312 may be one or more devices which accept the filtered power.

Figure 4:
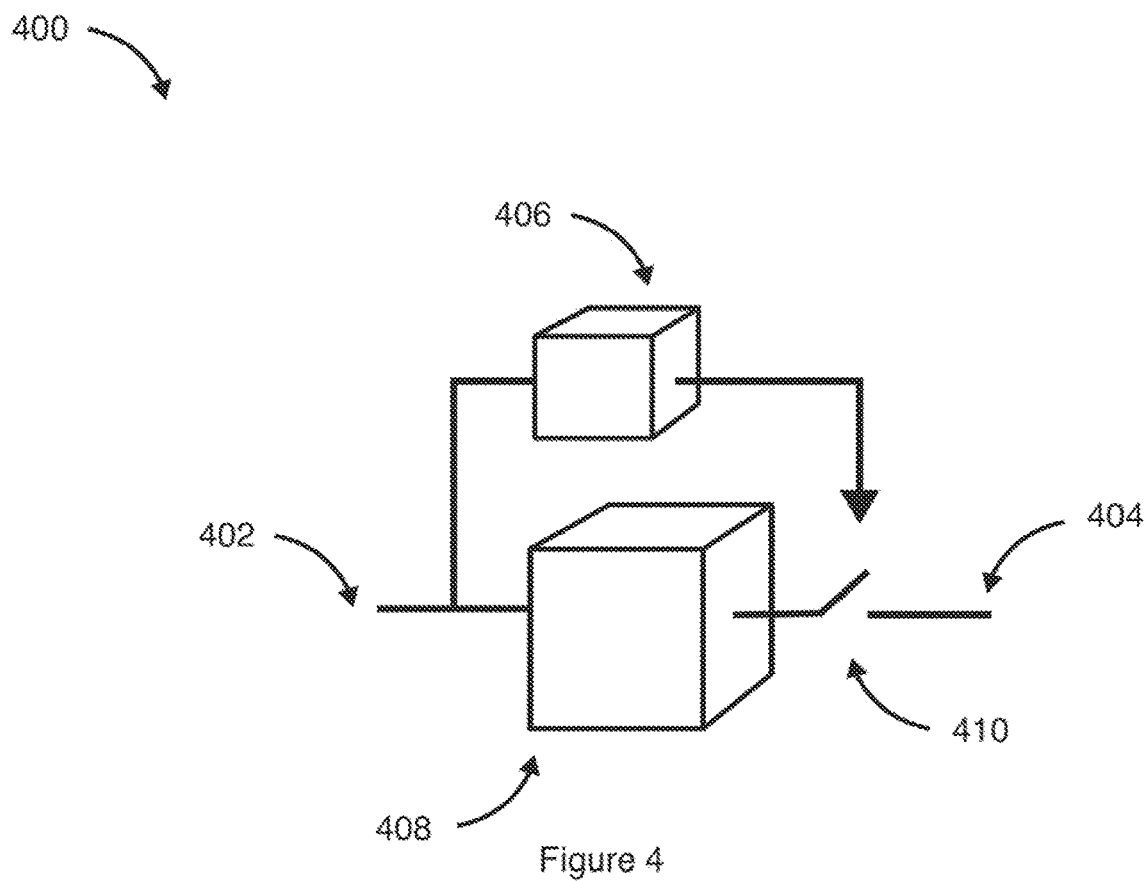
FIG. 4 is an example of a filtering extractor system, according to one embodiment of the invention.

FIG. 4 is an example of a filtering extractor system, according to one embodiment of the invention. As shown, the filtering extractor system 400 includes an input power line 402 and an output power line 404, as well as a sensing low-pass filter 406 in parallel with a primary low-pass filter 408.

The input power line 402 supplies the AC and/or DC power to the components. It is shown directly feeding the sensing low-pass filter 406 and the primary low-pass filter 408. The output power line 404 is shown selectably connected via a switch 410 to the primary low-pass filter 408, such that when the switch 410 completes the circuit, the primary low-pass filter 408 provides a filtered signal to downline components. The sensing low-pass filter 406 measures the current on the line and controls whether the switch 410 is in the open or closed state. When the desired current on the line is sensed by the sensing low-pass filter 406, the switch 410 is closed, and the primary low-pass filter 408 is allowed to filter the input signal from input power line 402 and provide a filtered signal to output power line 404. In another embodiment, the switch 410 could be before the primary low-pass filter 408. In another embodiment, the sensing low-pass filter 406 could monitor the output of the primary low-pass filter 408 instead of being in parallel with the primary low-pass filter 408.

Figure 5:
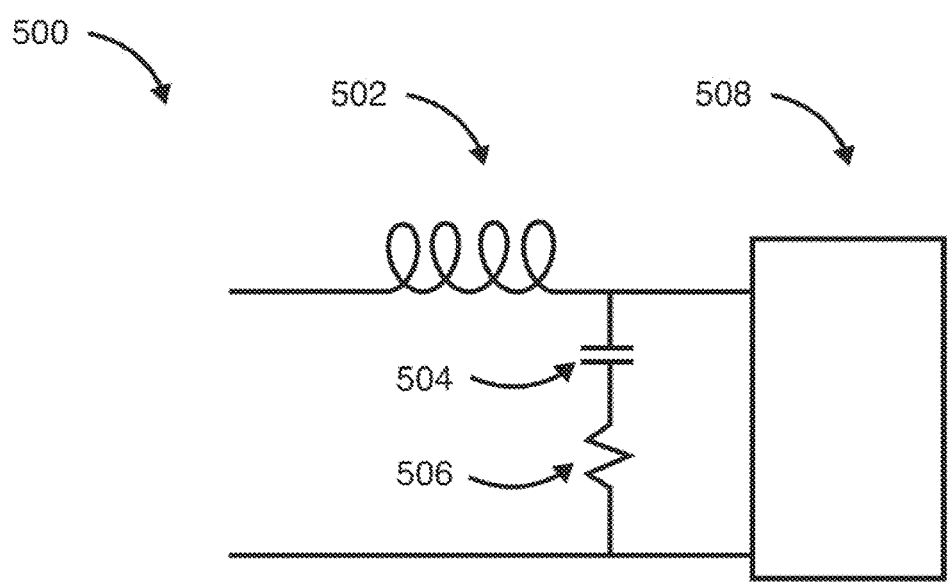
FIG. 5 is an example of a low-pass filter, according to one embodiment of the invention.

FIG. 5 is an example of a low-pass filter, according to one embodiment of the invention. As shown, the filter 500 includes an inductor 502, capacitor 504, resistor 506, and a load 508. The capacitor 504 and resistor 506 are in parallel with the load 508, and the two parallel lines are in series with the inductor 502. The capacitor 504, at lower frequencies, will have a much higher capacitive reactance, which may cause a voltage drop across the lines at certain frequencies. Further, as the inductor 502 and capacitor 504 are in series, the line with the capacitor 504 may pit the reactance of the capacitor 504 and inductor 502 against each other and may operate as if there were neither component in the line. It may also be used to selectively filter the line, either letting certain frequencies through or only blocking a range of frequencies.

Figure 6:
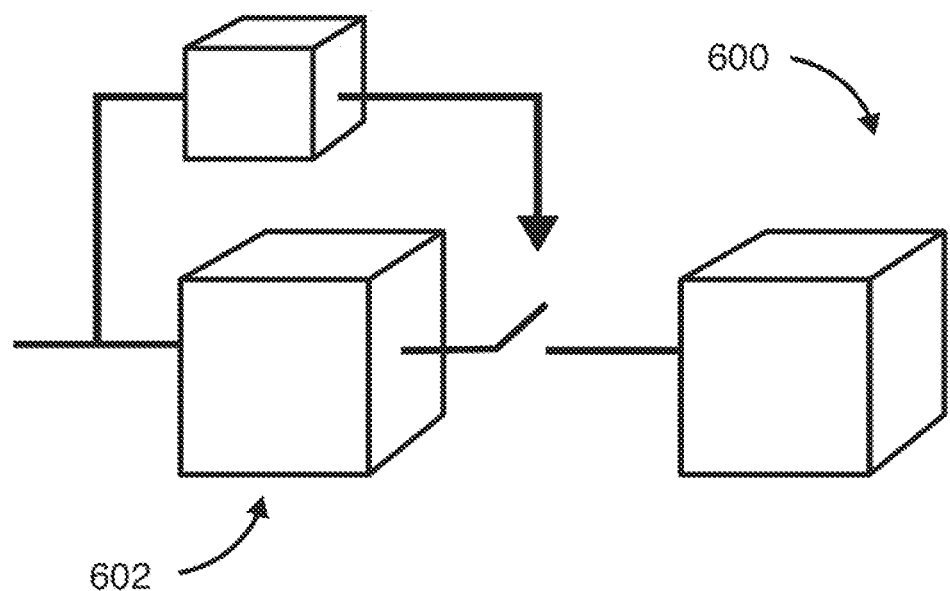
FIG. 6 shows a polarity protection circuit connected to an output from the low-pass filter, according to one embodiment of the invention.
Figure 7:
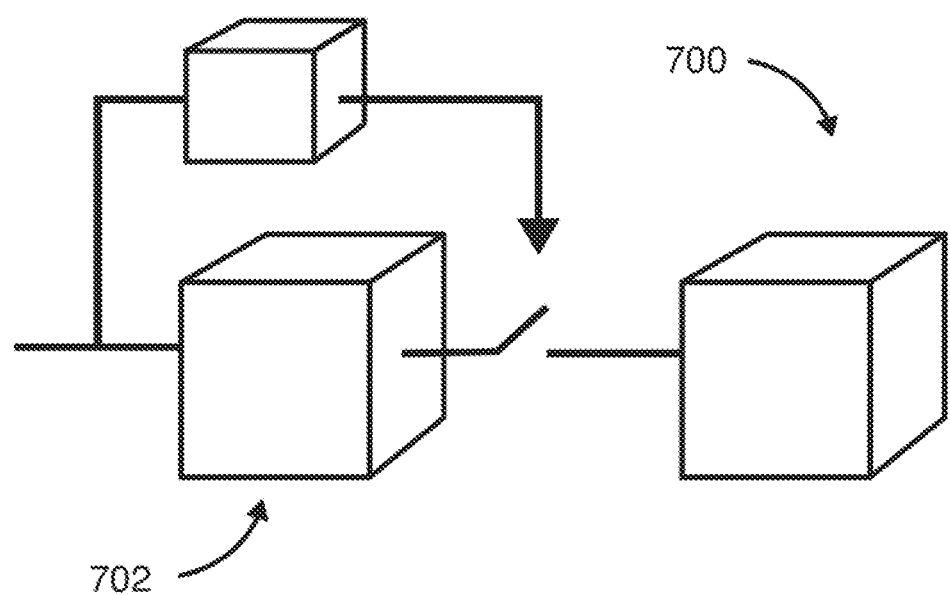
FIG. 7 shows an overcurrent protection circuit connected to an output from the low-pass filter, according to one embodiment of the invention.
Figure 8:
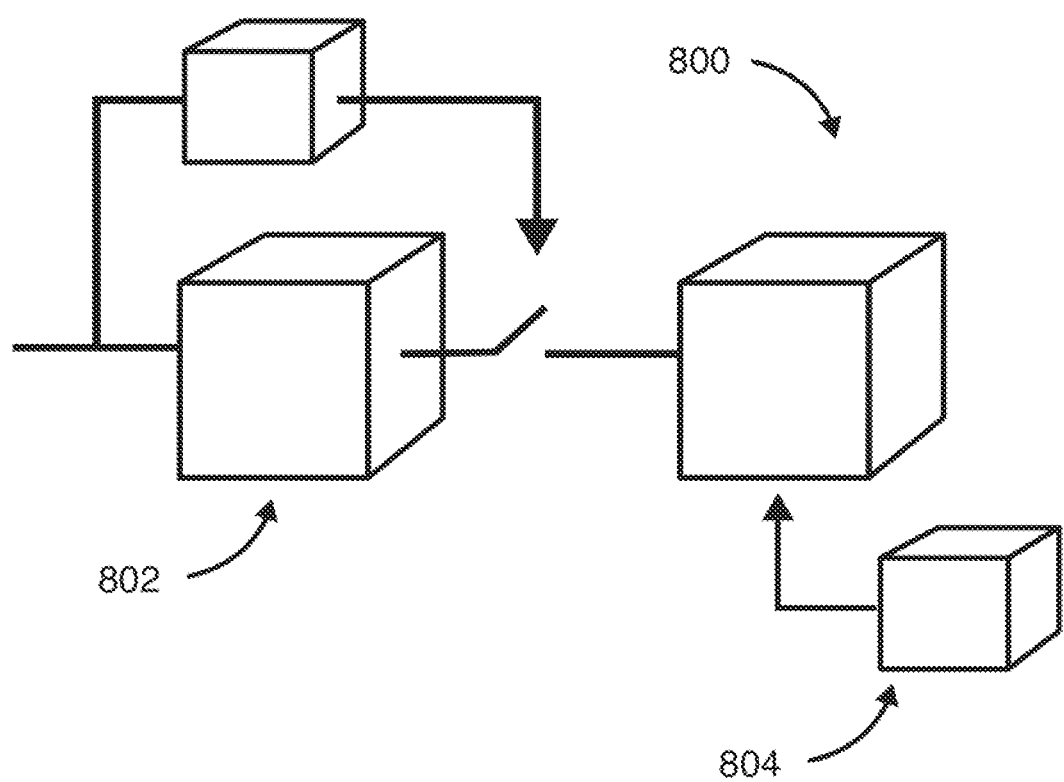
FIG. 8 shows a current limiting circuit connected to the output from a low-pass filter, according to one embodiment of the invention.

FIGS. 6, 7, and 8 are various examples of a filtering circuit combined with various protection devices to monitor the circuit and prevent dangerous conditions and/or component damage. Any number of the various protection devices, 600, 700, 800, may be used within the device depending on the desired application. In some embodiments, the protection devices, 600, 700, 800, may not be present at all.

FIG. 6 shows a polarity protection circuit 600 connected to the output from the primary low-pass filter 602. In one embodiment with only low output voltages and currents, a singular diode may be used as the polarity protection circuit 600. In the case of a singular diode polarity protection circuit 600 the diode will only conduct in one direction, such that when the polarity is flipped, the diode will block the passage of current and the circuit will be protected. In another embodiment, there may be a rectifier bridge used, wherein multiple diodes are placed within the circuit. An advantage of a rectifier bridge is such that even when the device has reversed polarity from being plugged in incorrectly, the diodes are positioned to block the current from certain paths and direct it to the load in the desired way, and then feed the current back to the negative pole. There are many other diode-based polarity protection circuits 600, such as ones including fuses, SRCs, relays, and the like and combinations thereof.

An example of a MOSFET polarity protection circuit 600 includes a P type MOSFET, however other MOSFETs may be used, such as N type. The MOSFET needs to be polarized to conduct, thereby preventing reverse-polarity situations from completing the circuit.

FIG. 7 shows an overcurrent protection circuit 700 connected to the output from the primary low-pass filter 702. In one embodiment, the overcurrent protection circuit 700 may be a fuse, wherein the fuse is rated for certain current and below, such that when too much current attempts to flow through the fuse, the resistance is too high and the fuse heats up and melts, disconnecting and opening up a gap in the circuit, thereby preventing electricity from flowing further. In one embodiment, the overcurrent protection circuit 700 may be a circuit breaker, wherein the circuit breaker is rated for certain current and below, such that when too much current attempts to flow through the circuit breaker, there is an electromagnet which becomes magnetized and pulls a switch, disconnecting and opening up a gap in the circuit, thereby preventing electricity from flowing further. Other circuit breakers use a bending bimetallic strip which bends and opens the circuit, while others may monitor current levels and switch themselves, while further designs may use a ground fault circuit interrupter, which monitors current in both the neutral and hot wire to determine whether to disable the circuit.

FIG. 8 shows a current limiting circuit 800 connected to the output from the primary low-pass filter 802. The current limiting circuit 800 is shown driven by a heat sensor 804, however in some embodiments, the heat sensor 804 may not be used. A current limiting circuit 800 is desirable for LEDs, as LEDs are particularly vulnerable to heat. Lower current examples include current limiting resistors, which drag the current down to acceptable levels. Further embodiments may use transistors. Higher current and wattage examples may make use of a MOSFET. As shown, there is a heat sensor 804 that may provide a warning to the user if the circuit components are becoming too hot or if there is too much current on the line. The heat sensor 804 in some embodiments may just provide a warning, however in other embodiments the heat sensor 804 may be functionally connected to the current limiting circuit to assist protecting the components.

Figure 9:
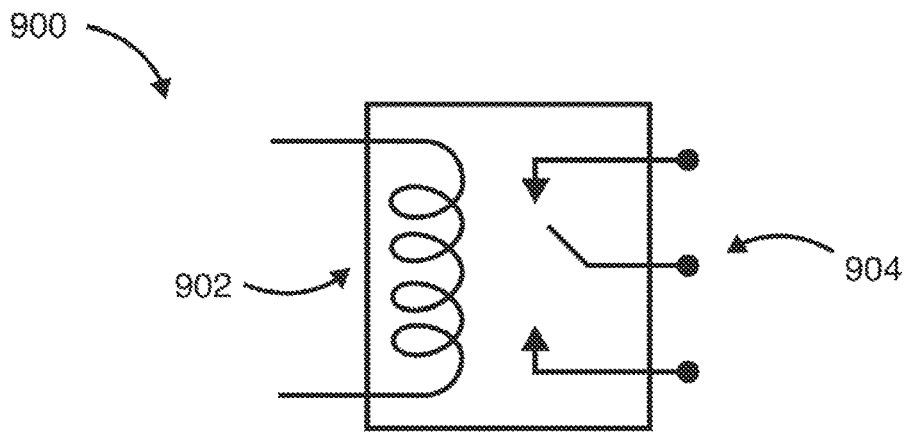
FIG. 9 shows a relay with an inductor and a switch, according to one embodiment of the invention.

FIGS. 9-12 show various examples of electrical components which may be used within the device. FIG. 9 shows a relay 900, with an electromagnet 902 and a switch 904, which physically switches between two or more different lines. The relay 900 is used to switch between desirable circuits, or to switch between connected and disconnected states.

Figure 10:
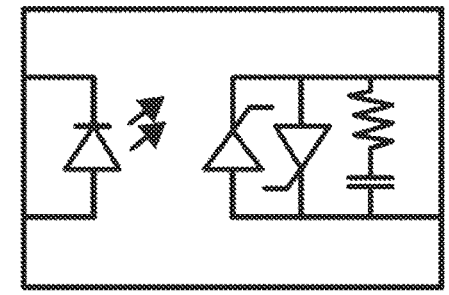
FIG. 10 shows a solid-state relay, according to one embodiment of the invention.

FIG. 10 shows a solid-state relay 1000, which electrically switches between two or more different lines. Similarly to the relay, the solid-state relay is used to switch between different circuits depending on the device state, or to switch between connected and disconnected states.

Figure 11:
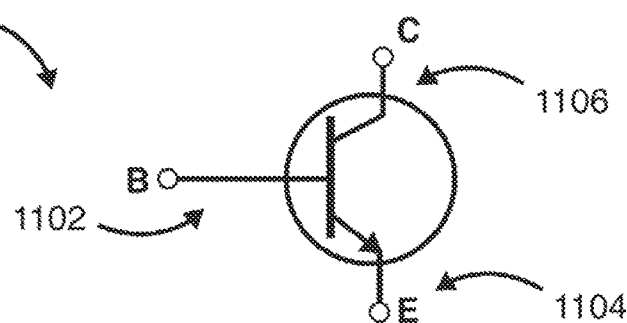
FIG. 11 shows a power transistor which may be used as a switch and/or an amplifier in higher power applications, according to one embodiment of the invention.

FIG. 11 shows a power transistor 1100 which may be used as a switch (similarly to the relay and/or solid-state relay) and/or an amplifier in higher power applications. As shown, this is an NPN transistor variation with a base 1102, emitter 1104, and collector 1106, however in other embodiments other power transistors may be used, such as a PNP variation transistor.

Figure 12:
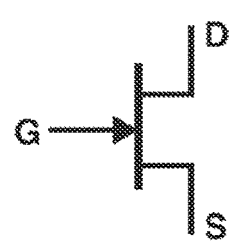
FIG. 12 shows a MOSFET which may be used to amplify and/or switch signals, according to one embodiment of the invention.

FIG. 12 shows a MOSFET 1200 which may be used to amplify and/or switch signals, similarly to the power transistor.

Figure 13:
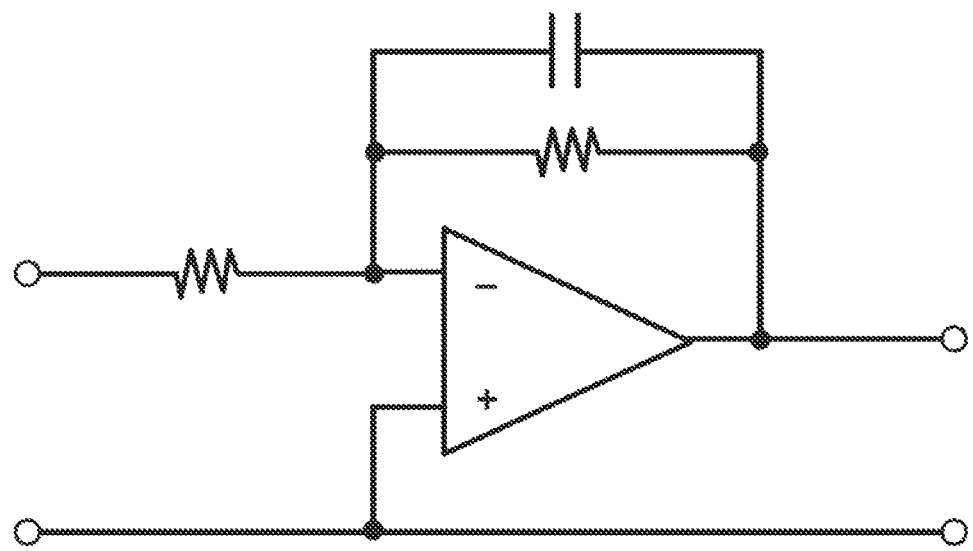
FIG. 13 shows an operational amplifier, according to one embodiment of the invention.

FIG. 13 shows an operational amplifier 1300, according to one embodiment of the invention. The operational amplifier 1300 is used to amplify weaker signals, by taking the voltage difference between the input pins, amplifying it, and outputting it. The illustrated operational amplifier 1300 is structured as a low-pass filter, which reduces the voltage output above the cutoff frequency and can be used as the sensing low-pass filter to control the switch in the DC sensing circuit, however in other embodiments there may be other types of operational amplifiers used.

Figure 14:
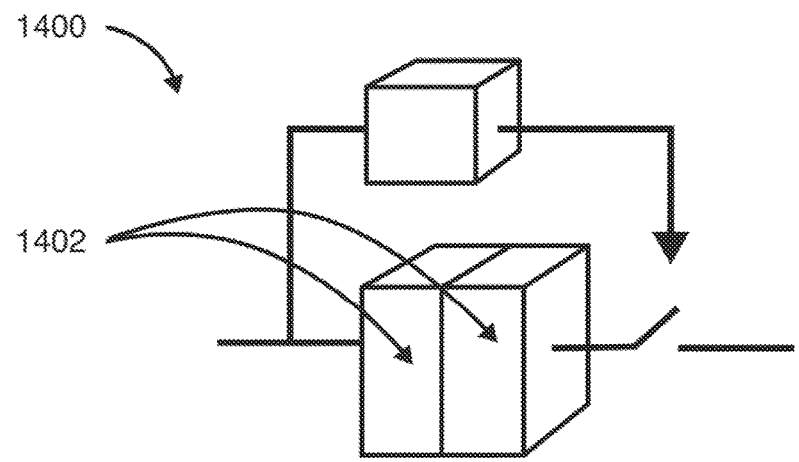
FIG. 14 shows a higher order low-pass filter, according to one embodiment of the invention.
Figure 15:
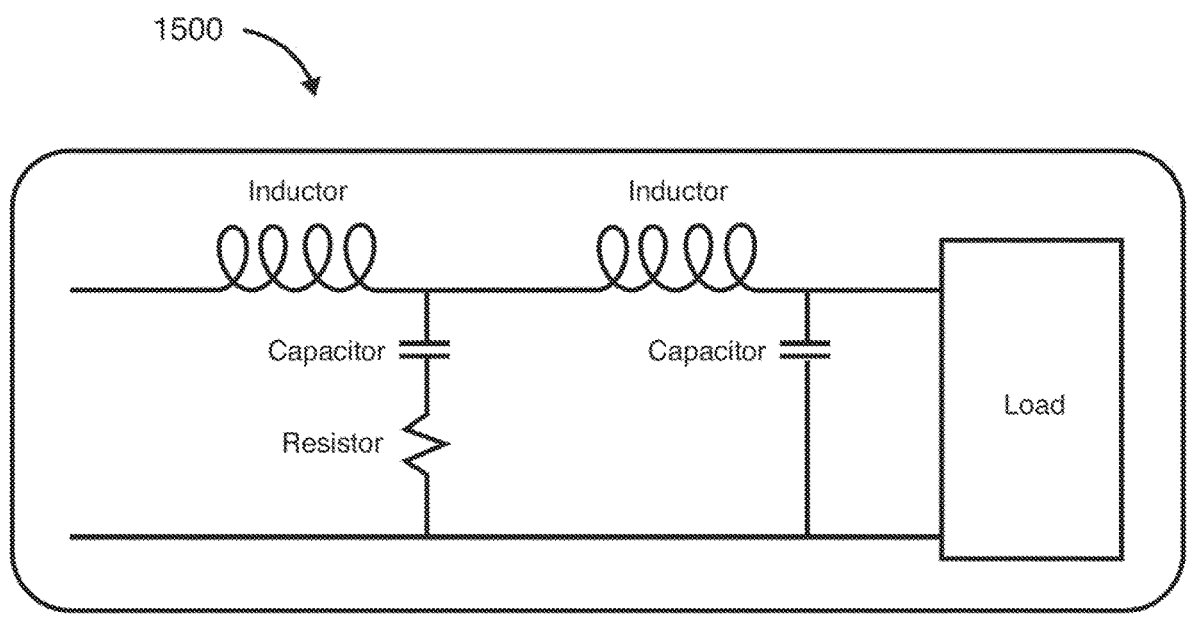
FIG. 15, shows a forth-order low-pass filter created from a pair of second-order low-pass filters, according to one embodiment of the invention.

FIGS. 14 and 15 show a higher order low-pass filter, according to multiple embodiments of the invention. The higher order low-pass filter functions the same way as a first order filter, however, attenuates the frequency much more steeply. As shown in FIG. 14, the higher order low-pass filter 1400 includes multiple lower order low-pass filters 1402.

As shown in FIG. 15, the illustrated low-pass filter 1500 is a forth-order low-pass filter created from a pair of second-order low-pass filters. There may be higher order low-pass filters 1500 using the same structure with more or fewer low-pass filters, however in other embodiments, the higher order filters 1500 may use other components in place of chained lower order filters such as virtual inductors, operational amplifiers, and the like known to those skilled in the art.

Figure 16:
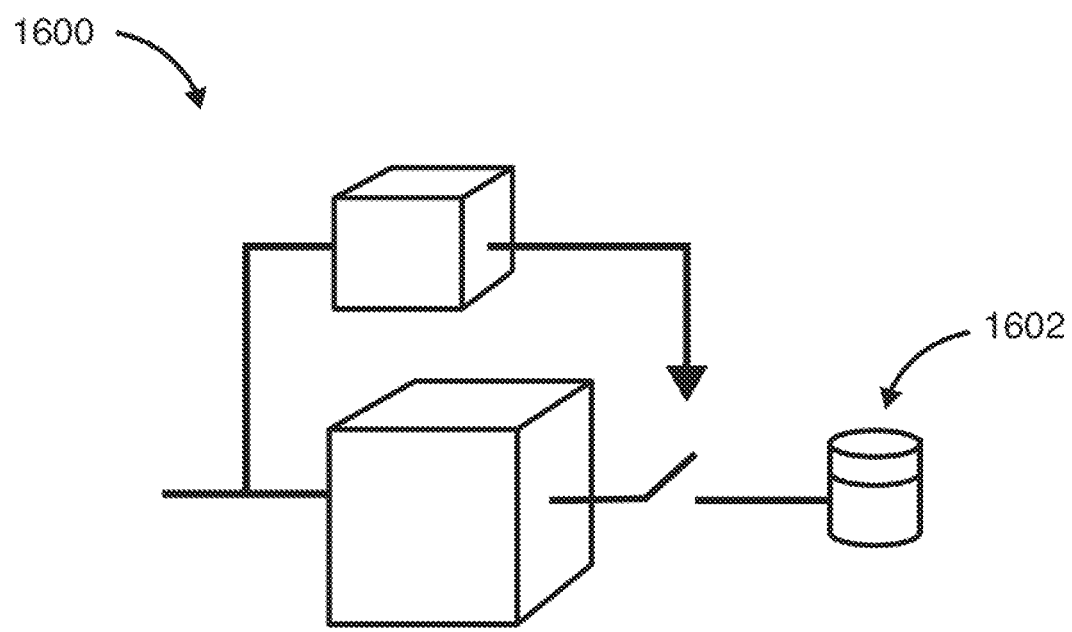
FIG. 16 shows a filtering system connected to a light, according to one embodiment of the invention.

FIG. 16 shows a filtering system 1600 connected to a light 1602, according to one embodiment of the invention. As shown, this filters power such that the power provided is compatible with the light 1602 and then provides it directly to the light 1602 without intermediate protections. In other embodiments, the filtering system 1600 may be downline from the filtering extractor device, such that the light 1602 or a device paired directly to the light 1602 intermediate the filtering extractor device and light 1602 would filter out the signal, such that the filtering extractor need not fully clean the signal it output, or in some embodiments, clean it at all.

Further, it should be known that the light 1602 is a placeholder device. The light 1602 may be any number of devices which take low frequency AC or DC power. There may be a plurality of different devices which use same or dissimilar power sources in the same configuration as shown in FIG. 16.

Figure 17:
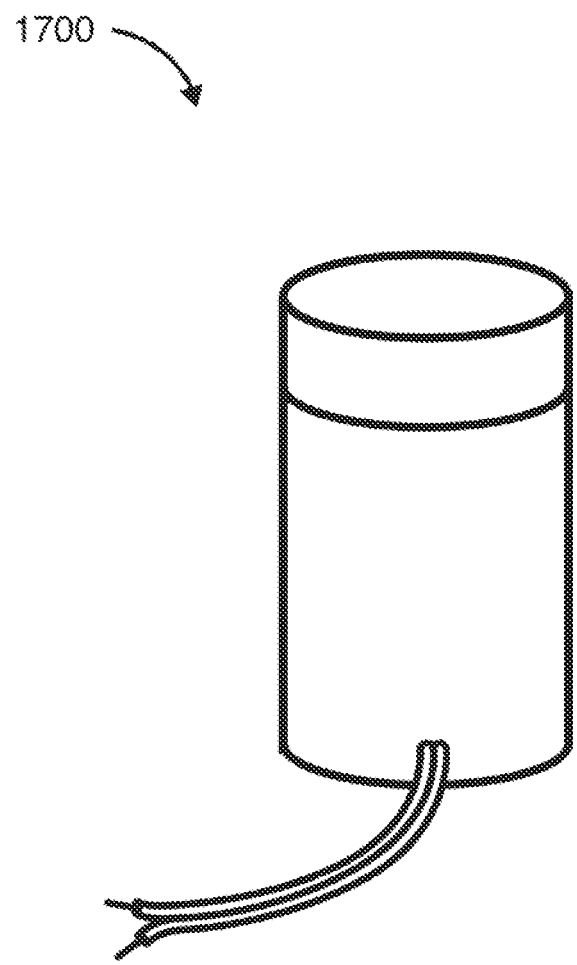
FIG. 17 shows a powered device, according to one embodiment of the invention.

FIG. 17 shows a powered device, according to one embodiment of the invention. The device 1700 in some embodiments is connected to the filtering system and is powered using the leftover AC or DC power that has not been filtered out. In other embodiments, the device 1700 may be any number of components desired to be powered by low frequency AC or DC power. The following are non-limiting examples of various powered devices which may be utilized with one or more embodiments described herein: lights, speakers, pumps, electrical signal transmission devices, electrical motors, and the like and combinations thereof.

Figure 18:
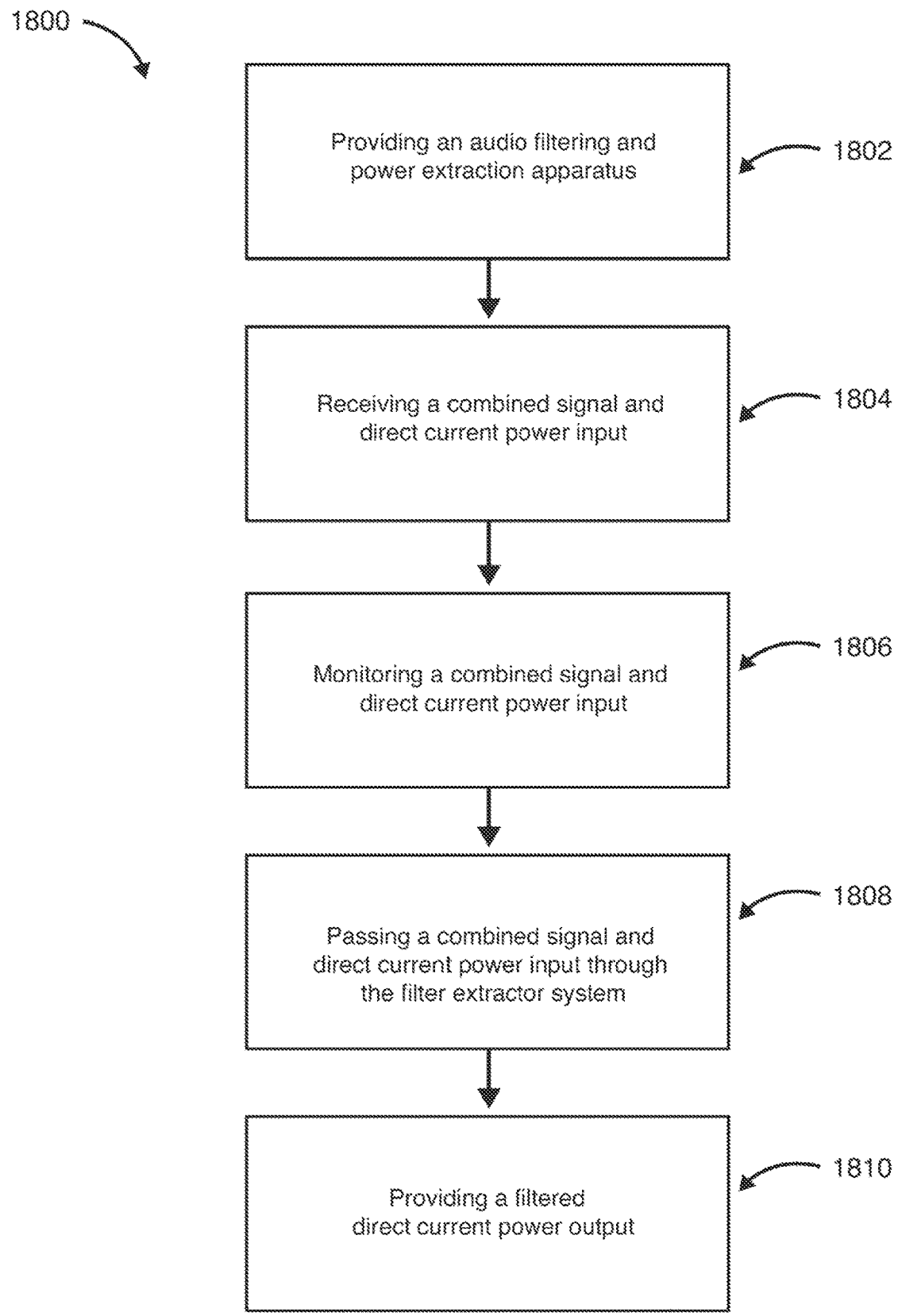
FIG. 18 is a method of filtering power signals, according to one embodiment of the invention.

FIG. 18 is a method of filtering power signals, according to one embodiment of the invention. There is shown a method of filtering power signals 1800, including the steps of providing an audio filtering and power extraction apparatus 1802, receiving a combined signal and direct current power input 1804, monitoring a combined signal and direct current power input 1806, passing a combined signal and direct current power input through the filter extractor system 1808, and providing a filtered direct current power output 1810.

The step of providing an audio filtering and power extraction apparatus 1802 includes providing a device that accepts combined AC and DC on the same line. Further the device must be capable of filtering out AC and/or DC power and passing a filtered signal out. Such a device may be one of the various embodiments described herein, or a similar system using the general structure provided herein and making one or more various modifications.

The step of receiving a combined signal and direct current power input 1804 includes sending such a signal with AC and DC power to the audio filtering and power extraction device. This step may include providing the sources for the combined signal and direct current power, and in some cases may require the components to combine the signals and power on the same line. However, in other embodiments, there may instead be the source already provided and simply functionally connecting such source to the provided device which accepts such and input.

The step of monitoring a combined signal and direct current power input 1806 includes having one or more devices which sense AC and/or DC power, current, signal coming into the device or passing through the device. Such may include the various devices described herein, or may include other commonly known monitoring devices which would be known by those skilled in the art.

The step of passing a combined signal and direct current power input through the filter extractor system 1808 includes taking the input and manipulating it within the filter extractor system such that the input power and output power are not identical. In some embodiments, this may be thinning out certain wavelengths of power for further devices to finish filtering. In other embodiments, this may include providing purely filtered AC and/or DC power such that no filtering is necessary for a downline device to function properly.

The step of providing a filtered direct current power output 1810 includes taking a filtered DC power output and providing it to a downline device such that the device only receives DC power and not AC power or combined power. In other embodiments, this may also or instead include providing a filtered alternating current to a downline device such that the device only receives AC power.

It is understood that the above-described embodiments are only illustrative of the application of the principles of the present invention. The present invention may be embodied in other specific forms without departing from its spirit or essential characteristics. The described embodiment is to be considered in all respects only as illustrative and not restrictive. All changes which come within the meaning and range of equivalency of the claims are to be embraced within their scope.

The present invention may be described herein in terms of functional block components, functions, options, features, and the like. Each of such described herein may be one or more modules in exemplary embodiments of the invention even if not expressly named herein as being a module. It should be appreciated that such functional blocks, various components, and etc. may be realized by any number of hardware components or electrical components configured or otherwise designed to perform the specified functions. Accordingly, a person skilled in the art would appreciate similar functioning components being used in place of any of the various embodiments of the invention described herein.

Further, it should be noted that the present invention may employ any number of conventional techniques for signal transmission, power transmission, and the like.

Thus, while the present invention(s) has been fully described above with particularity and detail in connection with what is presently deemed to be the most practical and preferred embodiment of the invention(s), it will be apparent to those of ordinary skill in the art that numerous modifications, including, but not limited to, variations in size, materials, shape, form, function and manner of operation, assembly and use may be made, without departing from the principles and concepts of the invention(s) as set forth in the claims. Further, it is contemplated that an embodiment may be limited to consist of or to consist essentially of one or more of the features, functions, structures, methods described herein.

What is claimed is:

1. An audio filtering and power extraction apparatus for filtering out audio signal and extracting power from a combined signal and direct-current power line including both DC power and an electrical audio signal, comprising:
   a. an input configured to functionally couple to a combined signal and direct-current power line;
   b. a filtering extractor system functionally coupled to the input, including:
      i. a DC sensing switch circuit; and
      ii. a second order low-pass filter functionally coupled to the DC sensing switch circuit, the second order low-pass filter including:
         1. An inductor or virtual inductor in combination with
         2. a capacitor and resistor in series with each other; and
   c. an output functionally coupled to an output of the filtering extractor system and through which output extracted power is provided.

2. The apparatus of claim 1, further comprising a polarity-protection circuit functionally coupled to the output.

3. The apparatus of claim 1, further comprising an over-current-protection circuit disposed within the apparatus such that current is limited therethrough.

4. The apparatus of claim 1, further comprising a heat sensor disposed within a body of the apparatus and functionally coupled to a current limiting circuit functionally coupled to the input or output.

5. The apparatus of claim 1, wherein the DC sensing switch circuit includes at least one of a relay, a solid state relay, a power transistor, or a MOSFET.

6. The apparatus of claim 1, wherein the DC sensing switch circuit includes an internal low-pass filter.

7. The apparatus of claim 1, wherein the second order low-pass filter forms part of a higher order low-pass filter.

8. The apparatus of claim 1, further comprising a light functionally coupled to the output.

9. The apparatus of claim 1, wherein the input includes only two functional electrical conductors.

10. An audio filtering and power extraction apparatus for filtering out audio signal and extracting power from a combined signal and direct-current power line including both DC power and an electrical audio signal, comprising:
    a. an input configured to functionally couple to a combined signal and direct-current power line, wherein the input includes only two functional electrical conductors;
    b. a filtering extractor system functionally coupled to the input, including:
       i. a DC sensing switch circuit including an internal low-pass filter; and
       ii. a second order low-pass filter functionally coupled to the DC sensing switch circuit, the second order low-pass filter including:
          1. An inductor or virtual inductor in combination with
          2. A capacitor and resistor in series with each other; and
    c. an output functionally coupled to an output of the filtering extractor system and through which output extracted power is provided.

11. The apparatus of claim 10, further comprising a polarity-protection circuit functionally coupled to the output.

12. The apparatus of claim 11, further comprising an overcurrent-protection circuit disposed within the apparatus such that current is limited therethrough.

13. The apparatus of claim 12, further comprising a heat sensor disposed within a body of the apparatus and functionally coupled to a current limiting circuit functionally coupled to the input or output.

14. The apparatus of claim 13, wherein the DC sensing switch circuit includes at least one of a relay, a solid state relay, a power transistor, or a MOSFET.

* * * * *